(12) United States Patent
Sultenfuss et al.

(10) Patent No.: US 10,931,074 B2
(45) Date of Patent: *Feb. 23, 2021

(54) ASSEMBLY OF WORLDWIDE AC ADAPTER SUPPORTING FOLDABLE PRONGS

(71) Applicant: Dell Products, L.P., Round Rock, TX (US)

(72) Inventors: Andrew Thomas Sultenfuss, Leander, TX (US); Priyank Jatin Gajiwala, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/884,964

(22) Filed: May 27, 2020

(65) Prior Publication Data

US 2020/0287340 A1     Sep. 10, 2020

Related U.S. Application Data

(63) Continuation of application No. 16/705,834, filed on Dec. 6, 2019, now Pat. No. 10,700,484, which is a continuation of application No. 16/258,038, filed on Jan. 25, 2019, now Pat. No. 10,535,965.

(51) Int. Cl.
| | |
|---|---|
| *H01R 29/00* | (2006.01) |
| *H01R 31/06* | (2006.01) |
| *H01R 13/52* | (2006.01) |
| *H05K 1/11* | (2006.01) |
| *H01R 35/04* | (2006.01) |
| *H01R 24/68* | (2011.01) |
| *H01R 13/15* | (2006.01) |

(52) U.S. Cl.
CPC ........... *H01R 31/065* (2013.01); *H01R 13/15* (2013.01); *H01R 13/5213* (2013.01); *H01R 24/68* (2013.01); *H01R 35/04* (2013.01); *H05K 1/117* (2013.01)

(58) Field of Classification Search
CPC ...... H01R 29/00; H01R 27/00; H01R 103/00; H01R 4/34; H01R 13/652
USPC ....... 439/170, 171, 172, 174, 175, 217, 218, 439/221, 103, 106
See application file for complete search history.

(56) References Cited

U.S. PATENT DOCUMENTS

| | | |
|---|---|---|
| 7,938,653 B2 | 5/2011 | Hopwood et al. |
| 10,535,965 B1 * | 1/2020 | Sultenfuss ............. H01R 24/30 |
| 10,700,484 B1 * | 6/2020 | Sultenfuss ........... H01R 31/065 |

(Continued)

*Primary Examiner* — Phuong Chi Thi Nguyen
(74) *Attorney, Agent, or Firm* — Fogarty LLP

(57) ABSTRACT

An AC (Alternating Current) plug for providing power via a power circuit is assembled by: selecting a cover that includes prongs and structures on an inner side; positioning a PCB (printed circuit board) that includes contact pads connecting the PCB to the power circuit on structures of the inner side of the cover; positioning the spring mounted terminals on structures on the inner side of the cover such that a first end of each spring mounted terminal is positioned on a contact pad of the PCB; positioning a cap on the spring mounted terminals, the PCB and the cover, such that assembly holes of the cap, the PCB and the cover are aligned; and fastening the cap to the cover, such that the first end of each spring mounted terminal is secured against a respective contact pad and each spring mounted terminal is loaded and exerts a force against a prong.

20 Claims, 6 Drawing Sheets

(56) References Cited

U.S. PATENT DOCUMENTS

| | | |
|---|---|---|
| 2002/0052138 A1 | 5/2002 | Janik |
| 2002/0119687 A1 | 8/2002 | Wen-Ching |
| 2002/0127918 A1* | 9/2002 | Kajiwara ............... H01R 31/06 439/651 |
| 2003/0211767 A1 | 11/2003 | Philips et al. |
| 2004/0209499 A1* | 10/2004 | Chung ................. H01R 33/945 439/131 |
| 2006/0089026 A1* | 4/2006 | Song ................... H01R 31/065 439/131 |

* cited by examiner

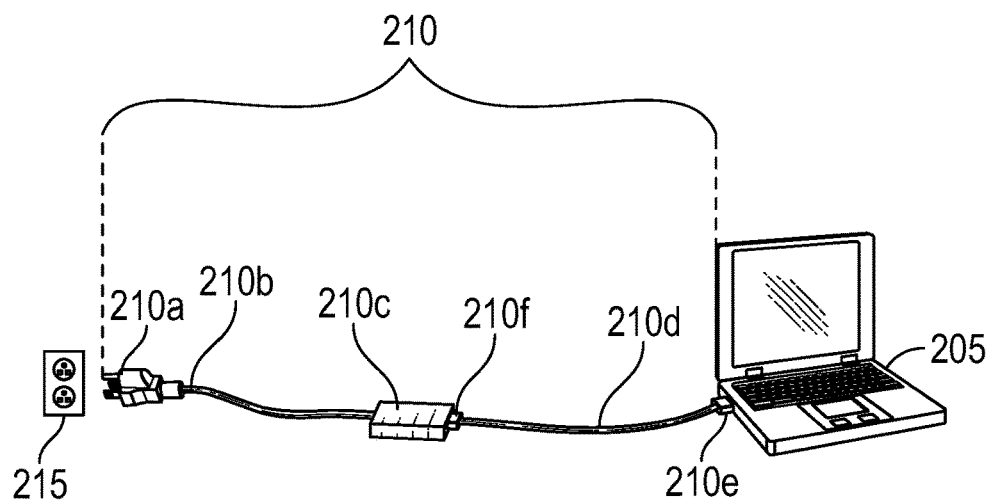
FIG. 2
(Prior Art)
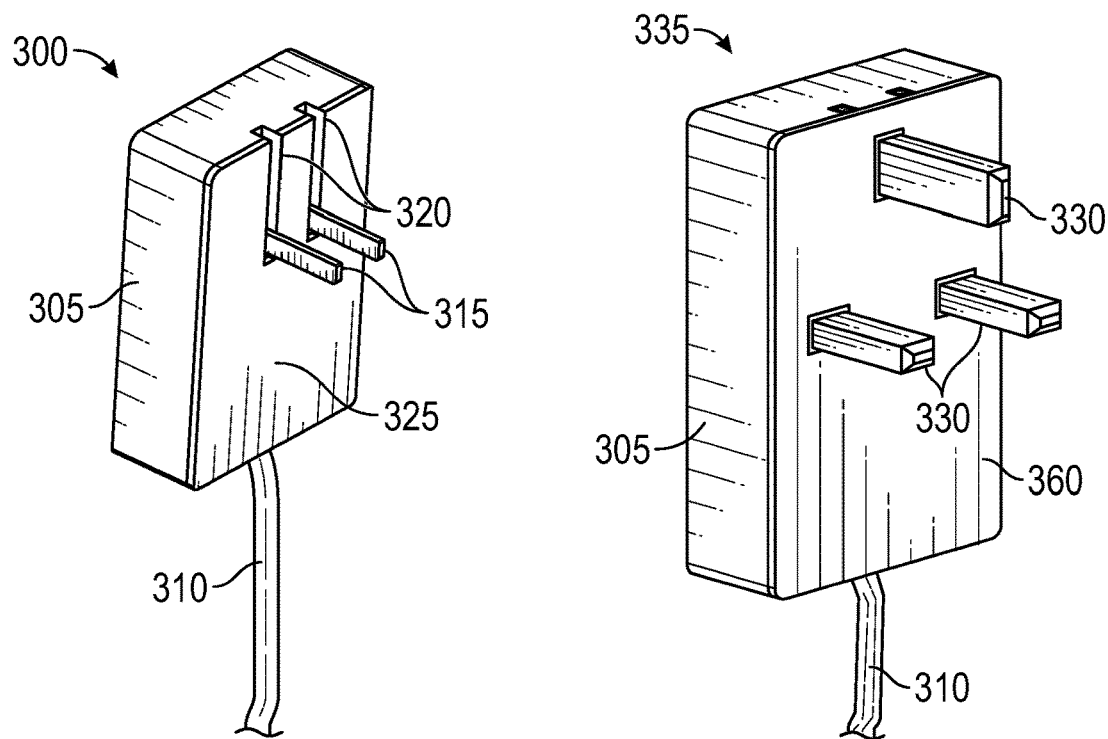
FIG. 3A
FIG. 3B

ASSEMBLY OF WORLDWIDE AC ADAPTER SUPPORTING FOLDABLE PRONGS

CROSS REFERENCE TO RELATED APPLICATIONS

This patent application claims priority to, and is a continuation of co-pending, commonly assigned U.S. patent application Ser. No. 16/705,834, filed Dec. 6, 2019 and also entitled "Assembly of Worldwide AC Adapter Supporting Foldable Prongs," which is a continuation of commonly assigned U.S. patent application Ser. No. 16/258,038, filed Jan. 25, 2019 and also entitled "Assembly of Worldwide AC Adapter Supporting Foldable Prongs" and issued as U.S. Pat. No. 10,535,965, on Jan. 14, 2020, both of which are hereby incorporated herein by reference.

FIELD

This disclosure relates generally to Information Handling Systems (IHSs), and more specifically, to AC (Alternating Current) adapters for charging portable IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Certain IHSs, such as laptops, tablets and mobile phones, are portable and are designed to operate using power supplied by rechargeable batteries. Power drawn from an electrical outlet may be used to charge the batteries of a portable IHS. Since the batteries of IHSs typically operate using DC (Direct Current) power, an AC adapter (i.e., AC/DC adapter or AC/CD converter) is required to convert the AC power from the wall outlet to DC power that can be used to charge the batteries. On one end, AC adapters include an AC plug that is inserted into the outlet. Many different types of AC plugs are utilized throughout the world, with different plugs from different regions utilizing different numbers, shapes and orientations of the prongs that conform to the electrical outlets used in a region. On the other end, AC adapters include a DC plug that includes a connector that is received by a power port of the portable IHS, where the power port is typically on a side or an edge of the IHS enclosure.

SUMMARY

In various embodiments, a method is provided for assembling an AC (Alternating Current) plug for providing power via a power circuit. The method includes: selecting a top cover for the AC plug, wherein an inner side of the top cover includes structures for receiving a PCB (printed circuit board) and for receiving a plurality of spring mounted terminals, and wherein the top cover comprises a plurality of prongs; positioning the PCB on structures of the inner side of the top cover, wherein the PCB comprises a plurality of contact pads connecting the PCB to the power circuit; positioning the plurality of spring mounted terminals on structures on the inner side of the top cover, wherein a first end of each spring mounted terminal is positioned on a contact pad of the PCB; positioning a cap on the spring mounted terminals, the PCB and the top cover, wherein assembly holes of the cap, the PCB and the top cover are aligned; and fastening the cap to the top cover, wherein the first end of each spring mounted terminal is secured against the contact pad, and wherein each spring mounted terminal is loaded and exerts a force against a prong of the plurality of prongs.

In additional method embodiments, the fastening connects the prongs to the power circuit via the contact pads and wherein no wires are included in the connections between the plurality of prongs and the power circuit. In additional method embodiments, a first selected top cover comprises a plurality of slots, and wherein the each of the plurality of prongs are foldable prongs that may be rotated into a slot of the top cover. In additional method embodiments, a second selected top cover comprises the plurality of prongs fixed to the outer side of the top cover. In additional method embodiments, the second selected top cover is selected from top covers comprising prongs conforming to electrical outlets used in different geographic regions. In additional method embodiments, the spring mounted terminals are positioned based on an alignment of the second end of each of the spring mounted terminals with an alignment structure of the top cover. In additional method embodiments, each of the plurality of prongs comprises a cam that contacts the respective spring mounted terminal when the foldable prongs are rotated to an extended position. In additional method embodiments, the cam of each of the plurality of prongs does not contact the respective spring mounted terminal when the foldable prongs are rotated to a folded position.

In various additional embodiments, an AC (Alternating Current) plug provides power to an Information Handling System (IHS) via a power circuit. The AC plug includes: a top cover, wherein an inner side of the top cover includes structures for receiving a PCB (printed circuit board) and for receiving a plurality of spring mounted terminals, and wherein the top cover comprises a plurality of prongs; the PCB positioned on structures of the inner side of the top cover, wherein the PCB comprises a plurality of contact pads connecting the PCB to the power circuit; the plurality of spring mounted terminals positioned on structures on the inner side of the top cover, wherein a first end of each spring mounted terminal is positioned on a contact pad of the PCB; and a cap positioned on the spring mounted terminals, the PCB and top cover, wherein assembly holes of the cap, the PCB and the top cover are aligned, wherein the cap is fastened to the top cover, wherein, due to the fastening, the first end of each spring mounted terminal is secured against the contact pad, and wherein, due to the fastening, each spring mounted terminal is loaded and exerts a force against a prong of the plurality of prongs.

In additional AC plug embodiments, the fastening connects the prongs to the power circuit via the contact pads and wherein no wires are included in the connections between the plurality of prongs and the power circuit. In additional AC plug embodiments, the top cover comprises a plurality of slots, and wherein the each of the plurality of prongs are foldable prongs that may be rotated into a slot of the top cover. In additional AC plug embodiments, the top cover comprises the plurality of prongs fixed to the outer side of the top cover. In additional AC plug embodiments, the top cover is selected from top covers comprising prongs conforming to electrical outlets used in different geographic regions. In additional AC plug embodiments, the spring mounted terminals are positioned based on an alignment of the second end of each of the spring mounted terminals with an alignment structure of the top cover. In additional AC plug embodiments, each of the plurality of prongs comprises a cam that contacts the respective spring mounted terminal when the foldable prongs are rotated to an extended position. In additional AC plug embodiments, the cam of each of the plurality of prongs does not contact the respective spring mounted terminal when the foldable prongs are rotated to a folded position.

In various additional embodiments, an AC (Alternating Current) adapter provides power to an Information Handling System (IHS) via a power circuit. The AC adapter includes an AC plug assembled by: selecting a top cover for the AC plug, wherein an inner side of the top cover includes structures for receiving a PCB (printed circuit board) and for receiving a plurality of spring mounted terminals, and wherein the top cover comprises a plurality of prongs; positioning the PCB on structures of the inner side of the top cover, wherein the PCB comprises a plurality of contact pads connecting the PCB to the power circuit; positioning the plurality of spring mounted terminals on structures on the inner side of the top cover, wherein a first end of each spring mounted terminal is positioned on a contact pad of the PCB; positioning a cap on the spring mounted terminals, the PCB and top cover, wherein assembly holes of the cap, the PCB and the top cover are aligned; and fastening the cap to the top cover, wherein the first end of each spring mounted terminal is secured against the contact pad, and wherein each spring mounted terminal is loaded and exerts a force against a prong of the plurality of prongs.

In additional AC adapter embodiments, the fastening connects the prongs to the power circuit via the contact pads and wherein no wires are included in the connections between the plurality of prongs and the power circuit. In additional AC adapter embodiments, a first selected top cover comprises a plurality of slots, and wherein the each of the plurality of prongs are foldable prongs that may be rotated into a slot of the top cover. In additional AC adapter embodiments, a second selected top cover comprises the plurality of prongs fixed to the outer side of the top cover, and wherein the second selected top cover is selected from top covers comprising prongs conforming to electrical outlets used in different geographic regions.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

FIG. 2 is a diagram depicting certain components of a prior art charging system that includes an AC adapter that is coupled to a laptop computer.

FIG. 3A is a diagram depicting certain components of an AC plug with foldable prongs according to various embodiments.

FIG. 3B is a diagram depicting certain components of an AC plug with fixed prongs according to various embodiments.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Figure 1:
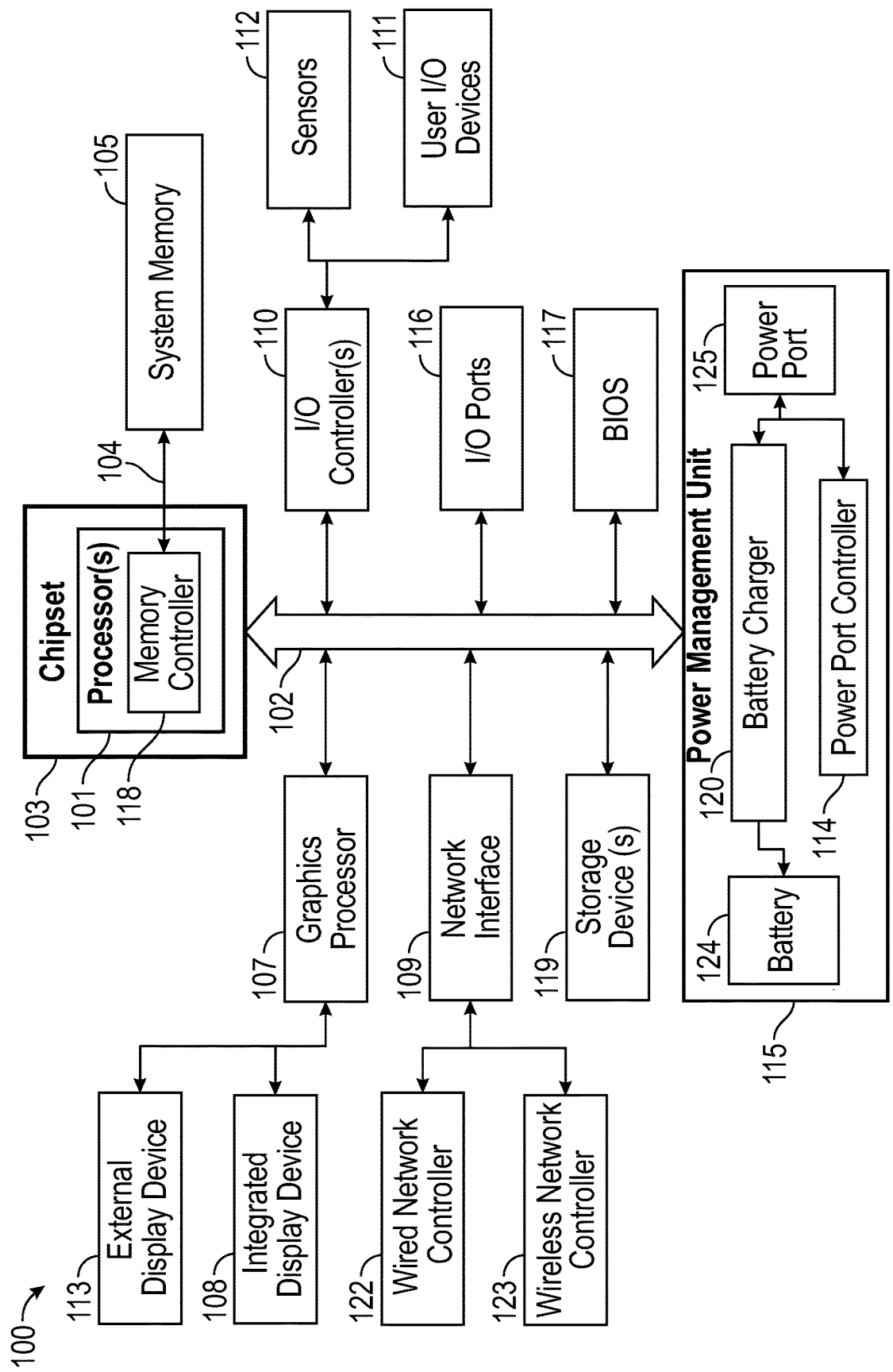
FIG. 1 is a block diagram depicting certain components of an IHS configured for operation with an AC power adapter according to various embodiments.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows an example of an IHS configured to implement the systems and methods described herein according to certain embodiments. It should be appreciated that although certain IHS embodiments described herein may be discussed in the context of a personal computing device, other embodiments may be utilized.

As described, certain portable IHSs may utilize AC adapters for drawing power from an electrical outlet and converting the power for use in recharging internal batteries from which the portable IHSs operate. However, once the charge of the internal batteries is depleted, the AC adapter must once again be used to recharge the batteries. In light of the need to frequently recharge batteries, a portable IHS is frequently transported along with an AC adapter. The resulting portability of AC adapters used for charging portable IHSs requires that such AC adapters be easy as possible to transport in ongoing support of the portable IHS. As provided, AC plugs vary in different regions. AC plugs from certain regions may support foldable prongs, while the orientation and arrangement of prongs in other regions may be more difficult to support reliable folding prongs. In addition, the lower cost of fixed prongs will continue to drive demand for fixed prong plugs. Accordingly, an assembly process for AC plugs is preferred that supports both assembly of both foldable and fixed prong plugs, while using as many components in common as possible in the assembly of the two types of plugs.

FIG. 1 is a block diagram illustrating certain components of an IHS 100 configured for operation with an AC power adapter according to various embodiments. In various embodiments, IHS 100 may include a power management unit 115 that includes logic that powers IHS 100 based on power drawn from an AC power adapter. While a single IHS 100 is illustrated in FIG. 1, IHS 100 may be a component of an enterprise system that may include any number of additional IHSs that may also be configured in the same or similar manner to IHS 100.

IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104.

The system memory 105 that is coupled to processor 101 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory. In certain embodiments, the system memory 105 may be comprised of multiple removable memory modules.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of buses to provide the illustrated pathways served by bus 102.

As illustrated, a variety of resources may be coupled to the processor(s) 101 of the IHS 100 through the chipset 103. For instance, chipset 103 may be coupled to a network interface 109 that may support different types of network connectivity. In certain embodiments, IHS 100 may include one or more Network Interface Controllers (NIC), each of which may implement the hardware required for communicating via a specific networking technology, such as Wi-Fi, BLUETOOTH, Ethernet and mobile cellular networks (e.g., CDMA, TDMA, LTE). As illustrated, network interface 109 may support network connections by wired network controllers 122 and wireless network controller 123. Each network controller 122, 123 may be coupled via various buses to the chipset 103 of IHS 100 in supporting different types of network connectivity, such as the network connectivity utilized in applications of the operating system of IHS 100.

Chipset 103 may also provide access to one or more display device(s) 108, 113 via graphics processor 107. In certain embodiments, graphics processor 107 may be comprised within a video or graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 108, 113 coupled to the IHS 100. The one or more display devices 108, 113 coupled to IHS 100 may utilize LCD, LED, OLED, or other display technologies. Each display device 108, 113 may be capable of receiving touch inputs such as via a touch controller that may be an embedded component of the display device 108, 113 or graphics processor 107, or may be a separate component of IHS 100 accessed via bus 102. As illustrated, IHS 100 may support an integrated display device 108, such as a display integrated into a laptop, tablet, 2-in-1 convertible device, or mobile device. IHS 100 may also support use of one or more external displays 113, such as external monitors that may be coupled to IHS 100 via various types of couplings.

In certain embodiments, chipset 103 may utilize one or more I/O controllers 110 that may each support hardware components such as user I/O devices 111 and sensors 112. For instance, I/O controller 110 may provide access to one or more user I/O devices 110 such as a keyboard, mouse, touchpad, touchscreen, microphone, speakers, camera and other input and output devices that may be coupled to IHS 100. Each of the supported user I/O devices 111 may interface with the I/O controller 110 through wired or wireless connections.

In certain embodiments, sensors 112 accessed via I/O controllers 110 may provide access to data describing environmental and operating conditions of IHS 100. For instance, sensors 112 may include geo-location sensors capable for providing a geographic location for IHS 100, such as a GPS sensor or other location sensors configured to determine the location of IHS 100 based on triangulation and network information. Various additional sensors, such as optical, infrared and sonar sensors, that may provide support for xR (virtual, augmented, mixed reality) sessions hosted by the IHS 100.

Other components of IHS 100 may include one or more I/O ports 116 the support removeable couplings with various types of peripheral external devices. For instance, I/O 116 ports may include USB (Universal Serial Bus) ports, by which a variety of external devices may be coupled to IHS 100. I/O ports 116 may include various types of ports and couplings that support connections with external devices and systems, either through temporary couplings via ports, such as USB ports, accessible to a user via the enclosure of the IHS 100, or through more permanent couplings via expansion slots provided via the motherboard or via an expansion card of IHS 100, such as PCIe slots.

Chipset 103 also provides processor 101 with access to one or more storage devices 119. In various embodiments, storage device 119 may be integral to the IHS 100, or may be external to the IHS 100. In certain embodiments, storage device 119 may be accessed via a storage controller that may be an integral component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud drive accessible via network interface 109.

As illustrated, IHS 100 also includes a BIOS (Basic Input/Output System) 117 that may be stored in a non-volatile memory accessible by chipset 103 via bus 102. Upon powering or restarting IHS 100, processor(s) 101 may utilize BIOS 117 instructions to initialize and test hardware components coupled to the IHS 100. The BIOS 117 instructions may also load an operating system for use by the IHS 100. The BIOS 117 provides an abstraction layer that allows the operating system to interface with the hardware components of the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

In the illustrated embodiment, IHS 100 also includes a power management unit 115 that receives power inputs used for charging batteries 124 from which the IHS 100 operates. IHS 100 may include one or more power ports 125 to which an AC adapter may be coupled. As described, an AC adapter may draw AC from an electrical outlet and convert the AC to a DC output that is provided to an IHS via a DC connector. The DC connector portion of an AC adapter may be inserted into a compatible power port 125 of an IHS 100, thus providing the power to the IHS. The DC power input received at power port 125 may be utilized by a battery charger 124 for recharging one or more internal batteries 124 of IHS 100.

In certain embodiments, power management unit 115 of IHS 100 may include a power port controller 114 that is operable for detecting the coupling of an AC adapter to power port 125. Upon detecting the coupling of an AC adapter, the power port controller 114 may interrogate the AC adapter in order to determine characteristics of the AC adapter. In certain embodiments, the AC adapter may be configured to report PSID (power supply identification) information that specifies attributes of the AC adapter, such as a manufacturer, rating and model number.

In certain embodiments, power port controller 114 may be a component of a system-on-chip from which the power management unit 115 operates. In certain embodiments, power port controller may an embedded controller that is a motherboard component of IHS 100, or a component of a power management unit 115 daughter card of IHS 100. In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

FIG. 2 is a diagram depicting components of an existing charging system, where the system includes an AC power adapter 210 coupled to laptop computer 205. In the illustrated system, AC power adapter 210 is used to charge the internal batteries of laptop computer 205. An AC power adapter 210 include several connected components that operate to draw AC power from an electrical outlet 215 and convert the AC input power to a DC output for delivery to laptop 205. One end of the AC power adapter 210 includes an AC plug 210*a* that includes three prongs that may be received by a socket provided by an AC electrical outlet 215.

As illustrated, an AC electrical cord 210*b* of AC adapter 210 connects AC plug 210*a* to converter 210*c*. One function of converter 210*c* is to convert the AC received from power cord 210*b* to DC that can be used to power IHSs compatible with the AC adapter 210. In certain instances, converter 210*c* may be referred to as a power brick. The output generated by converter 210*c* may be DC within a voltage range that supports the power requirements of IHSs compatible for charging using AC adapter 210. The DC output generated by converter 210*c* is provided to laptop 205 via a DC power cord 210*d* that supplies the DC output via a connector that is received by a power port of the laptop.

As illustrated, DC cord 210*d* also includes a DC plug 210*f* that may be received by a power port of converter 210*c*. Similar to DC plug 210*e* coupled to IHS 205, the DC plug 210*f* on the opposite end of DC cord 210*d* may be removed from the power port of converter 210*c*. DC plug 210*e* and DC plug 210*f* may be interchangeable for use in the power port of either converter 210*c* or IHS 205. In this manner, DC cord 210*d* may be reversible. In other charging system, DC cord 210*d* may be fixed to converter 210*c*.

FIGS. 3A and 3B are diagrams illustrating two types of AC plugs 300 and 335 that are assembled using certain components in common and using a technique that eliminates the need for wires connecting the prongs 315 and 330 to the power circuit supported by the AC plugs. The AC plug 300 of FIG. 3A is a foldable prong plug in which the prongs 315 may be folded into slots 320 provided in the top cover 325 of the plug. The AC plug 335 of FIG. 3B is a fixed prong plug that is assembled using some of the common components and using the same technique for coupling fixed prongs 330 to the power circuit supported by the AC plug 335. The assembly of AC plug 300 is described in detail with regard to FIG. 4 and the assembly of AC plug 335 is described with regard to FIGS. 6 and 7.

FIG. 3A is a diagram depicting certain components of an AC plug 300 with foldable prongs 315 according to various embodiments. In certain embodiments, AC plug 300 may be a component of an AC adapter used for charging the internal batteries of an IHS in a manner similar to the use of AC adapter 210 in charging the batteries of laptop 205. In such AC adapter embodiments, AC plug 300 replaces the prior art, fixed-prong AC plug 210*a*. Similar to the prior art fixed-prong AC plug 210*a* of FIG. 2, the prongs 315 of AC plug 300 may be received by a socket of an AC electrical outlet. The AC power drawn from an outlet by prongs 315 may be supplied to an AC adapter via wires of an AC cord 310. In certain embodiments, the wires of an AC cord 310 may connect the AC plug 300 to an AC/DC converter, such as converter 210*c* of FIG. 2.

Figure 5A:
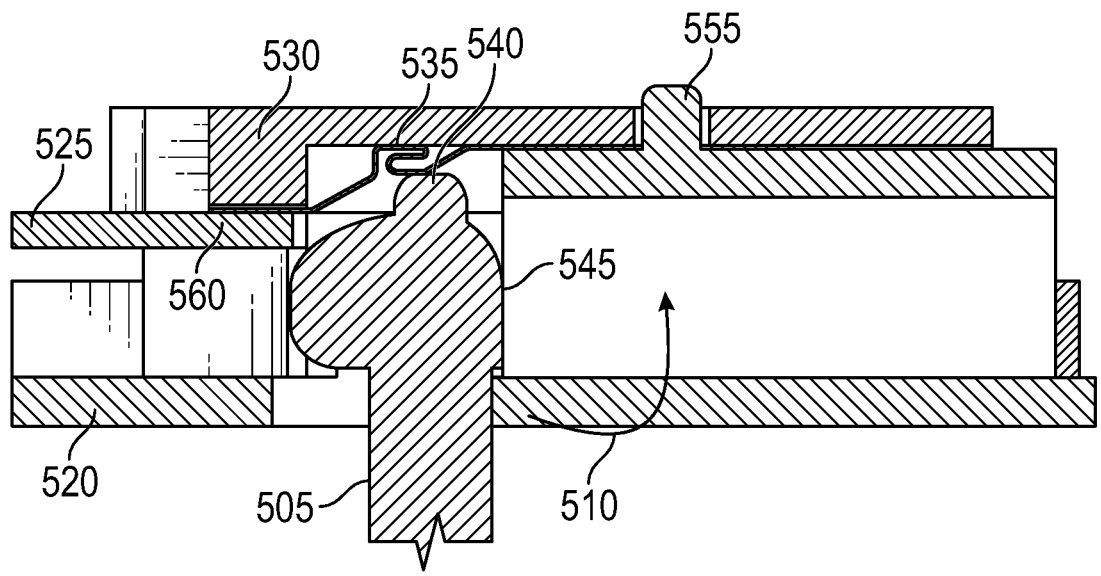
FIG. 5A is a cutaway diagram depicting certain components of an AC plug with foldable prongs in an extended position, according to various embodiments.
Figure 5B:
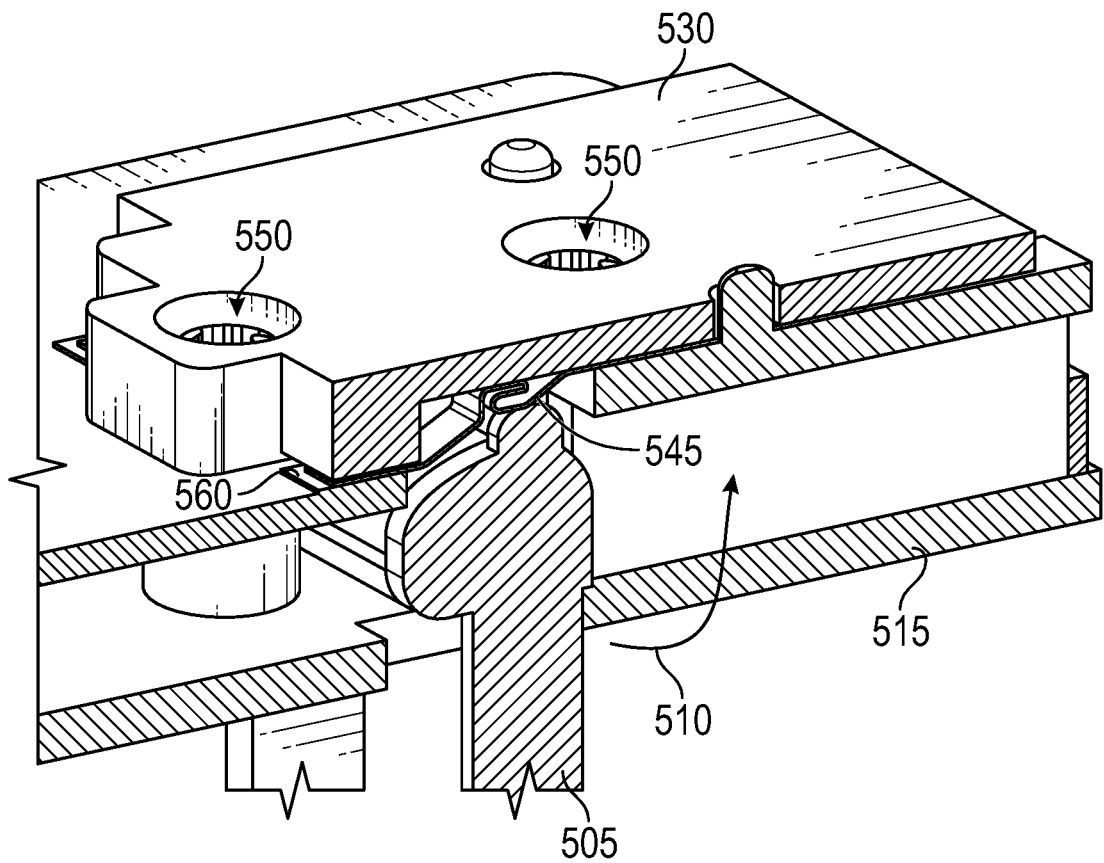
FIG. 5B is another cutaway diagram depicting another view of an AC plug with foldable prongs in an extended position, according to various embodiments.
Figure 5C:
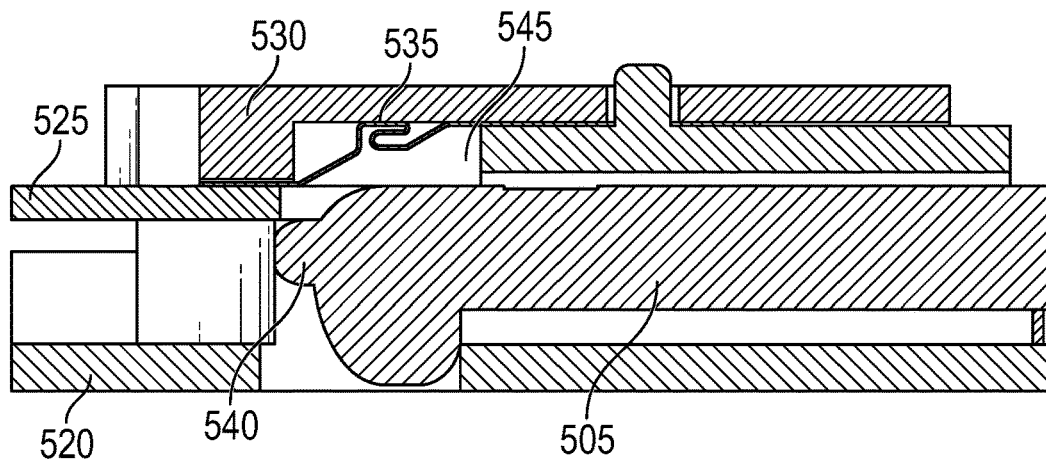
FIG. 5C is a cutaway diagram depicting an AC plug with foldable prongs in a folded position, according to various embodiments.

As described in additional detail with regard to FIGS. 5A-C, the prongs 315 of AC plug 300 may be folded within slots 320 provided in the top cover 325 of the AC plug 300.

In FIG. 3A, prongs 315 are illustrated in an extended position, thus allowing the prongs 315 of AC plug 300 to be inserted into the socket of an AC outlet. When not plugged into an AC outlet, the prongs 315 may be folded into slots 320 such that the prongs 315 are recessed within the housing of the AC plug 300 formed by the tub 305 and top cover 325. While retracted in this manner, the portability of the AC adapter utilizing AC plug 300 is improved as the retracted prongs no longer protrude from the housing, thus preventing the prongs 315 from damaging other items and reducing the bulkiness of the AC adapter.

FIG. 3B is a diagram depicting certain components of an AC plug 355 with fixed prongs 330 incorporated into a top cover 360, according to various embodiments. As with AC plug 300 of FIG. 3A, AC plug 305 may be a component of an AC adapter used for charging the internal batteries of an IHS and thus replaces the existing, fixed-prong AC plug 210a of FIG. 2. The AC power drawn from an outlet by prongs 355 may be supplied to an AC adapter via wires of an AC cord 310. In certain embodiments, the wires of an AC cord 310 may connect the AC plug 355 to an AC/DC converter, such as converter 210c of FIG. 2.

The fixed prongs 330 of AC plug 355 may be received by a socket of an AC electrical outlet. As described, many different types of AC plugs are utilized throughout the world, with different plugs from different regions utilizing different numbers, shapes and orientations of the prongs that conform to the electrical outlets used in a region. In North America, most general-purpose electrical outlets deliver 120 V of AC at a frequency of 60 hertz using a two-prong (Type A) or a grounded, three-prong (Type B) plug. Through the selection of top cover 360, the AC plug 355 of FIG. 3B, has been assembled as a Type G plug, with rectangular prongs arranged in a triangular pattern, such as utilized in the United Kingdom. Other common AC plugs that may be selected through the selection of a top cover include Type C plugs, used in Europe, that utilize two rounded prongs and the Type I plugs, used in Australia, that utilize flat prongs arranged in a V-configuration with an optional grounding prong.

Figure 6:
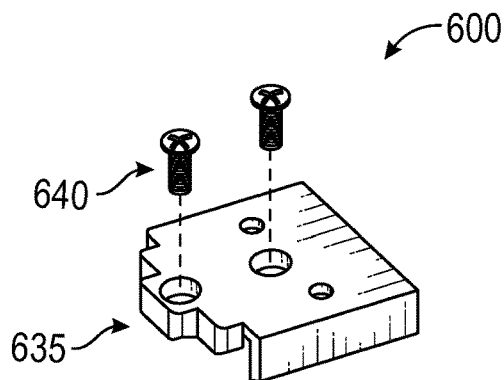
FIG. 6 is a diagram illustrating the assembly of an AC plug with fixed prongs according to various embodiments.
Figure 6:
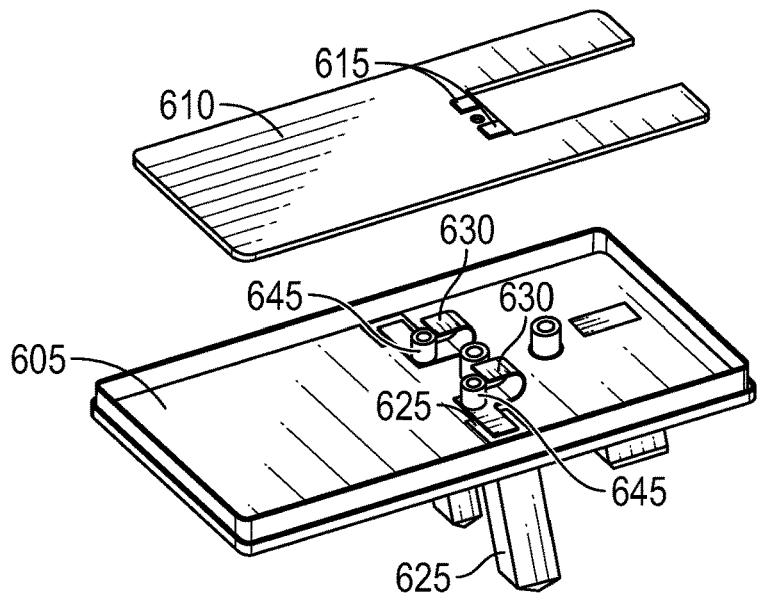
Figure 7:
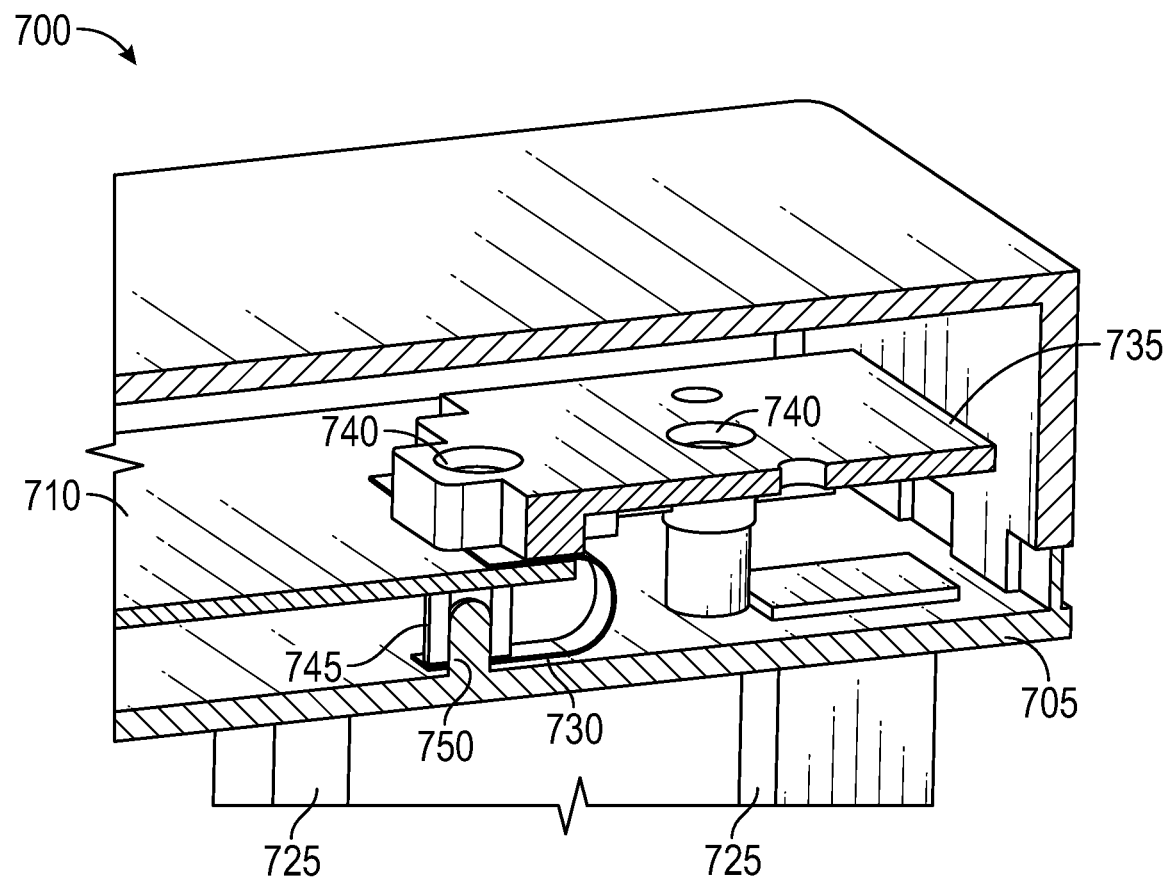
FIG. 7 is a cutaway diagram depicting certain components of an AC plug with fixed prongs, according to various embodiments.

As described in additional detail with regard to FIGS. 6 and 7, the fixed prong AC plug 355 may be constructed using the same assembly technique as used to assemble the foldable prong AC plug 300. Using this assembly technique, the prongs 315 and 330 are secured in a manner that does not require any wires to connect the prongs to the power circuit. Both types of AC plugs 300 and 355 utilize a common tub 305 that is sealed by installing a top cover supporting foldable prongs 325 or a top cover supporting a particular type of fixed prong outlet, such as the Type G plug 360. By fastening different types of top covers 325, 360 to the common tub 305, different types of AC plugs with different prong configurations may be assembled using a common technique and certain common parts, others of which are described with regard to the below embodiments.

In certain embodiments, AC plugs 300 and 335 may be components of an AC adapter used to provide power to an IHS such as the laptop 205 of FIG. 2. In other embodiments, AC plugs 300 and 335 may be components of an AC adapter similarly used to charge the batteries of other types of portable IHSs, such as tablets, 2-1 convertible laptops, mobile phones and smart watches. Embodiments may be implemented using all varieties of IHSs that operate on DC power supplied by internal rechargeable batteries and that also utilize an AC converter that may be plugged into an electrical outlet and used to charge the batteries of an IHS.

In certain embodiments, AC plugs 300 and 335 may be constructed using different configurations of top covers 325 and 360 and tubs 305. For instance, in certain embodiments, top cover 325 may be shaped more like a tub with an outer bottom side from which the prongs protrude and with walls that form the sides of the AC plug. The inner portions of such tub shaped top covers may support assembly in the same manner as described. In such embodiments, a blank cover may be used to seal the tub-shaped top cover. Various other configurations of covers and bases may be utilized to form AC plugs according to embodiments.

Figure 4:
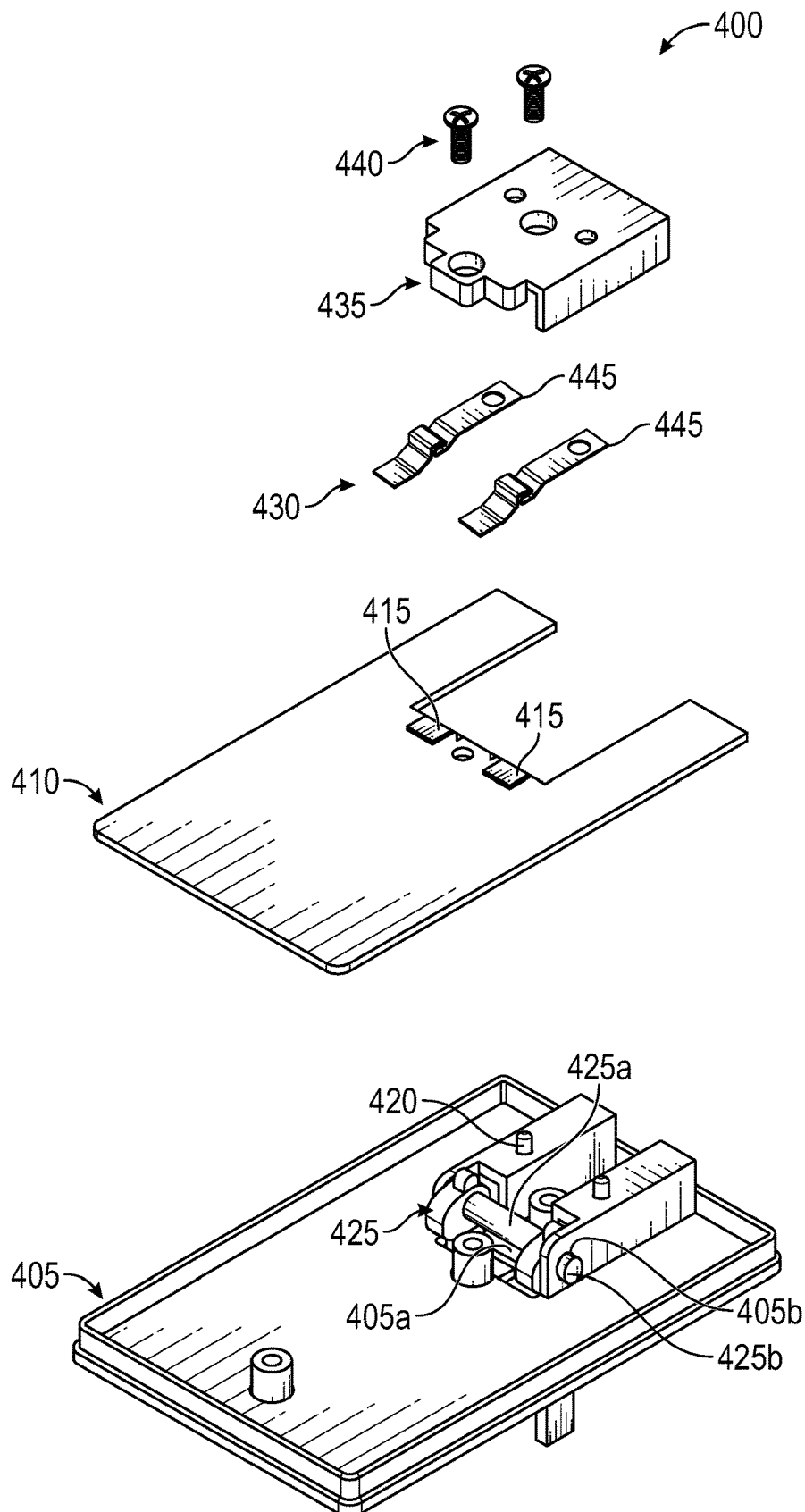
FIG. 4 is a diagram illustrating the assembly of an AC plug with foldable prongs according to various embodiments.

FIG. 4 is a diagram illustrating the assembly of an AC plug 400 with foldable prongs according to various embodiments. In certain embodiments, the AC plug 400 with foldable prongs may be assembled through stacking and fastening of the depicted components in the illustrated order. The foldable prong AC plug 400 may be constructed using the AC plug top cover 405 as an assembly base to which the remaining items of AC plug 400 may be fastened. In the illustrated embodiment, top cover 405 is the portion of AC plug 400 from which prongs 425 protrude while in an extended position. As provided in greater detail in FIGS. 5A-C, the inner side of top cover 405 includes structures 420 that provide slots in which prongs 425 are recessed while in a retracted position.

The assembly of a foldable prong AC plug 400 may begin with the selection of a top cover 405 that supports foldable prongs, in particular by including slots in which the prongs may be recessed and structures in which the foldable prongs may be mounted, but may still rotate between extended and recessed positions. In various embodiments, prongs 425 may be connected to each other via an insulating, cylindrical rod 425a. A preliminary step in assembling a foldable prong AC plug 400 may be securing prongs 425 in the top cover 405. In particular, prongs 425 may inserted and secured within a structure on the inner side of top cover 405 that includes a saddle 405a that receives the insulating cylinder 425a that connects the prongs 425. While resting on saddle 405a, cylinder 425a may be rotated, thus allowing prongs 425 to be folded within the slot structures 420 provided by top cover 405. In certain embodiments, prongs 425 may include protrusions 425b that may be snapped into corresponding holes 405b provided by the structures on the inners side of top cover 405, thus securing prongs 425 within the top cover, while still allowing rotation of the prongs 425 about the cylinder 425a such that the prongs 425 protrude from the outer side of top cover 405.

Upon selection of a top cover 405 that includes installed foldable prongs 425, a PCB (printed circuit board) 410 may be positioned on the inner side of the top cover 405 of the AC plug such that assembly holes of the PCB 410 and top cover 405 are aligned. As illustrated, PCB 410 may include electrical contact pads 415 that are positioned on the PCB 410 such that one end of each of the spring mounted terminals 430 are positioned on one of the contact pads 415. Electricity drawn from prongs 425, when in an extended position and inserted in an AC outlet, is transmitted to the contact pads 415 via the spring mounted terminals 430, as described in detail in FIG. 5A. In certain embodiments, PCB 410 may include circuitry that transmits electricity received at contact pads 415 to the wires of an AC cord connected to the AC plug 400, such as AC cord 310 of FIG. 3.

Once the PCB 410 have been positioned on the top cover 405, spring mounted terminals 430 may be stacked on to the assembly. In certain embodiments, spring mounted terminals 430 may be metal spring clips that are unloaded when prongs 425 are in a retracted position and are loaded by the rotation of prongs 425 to an extended position. In certain embodiments, each spring mounted terminal 430 may be positioned during assembly by aligning a hole 445 on one end of the terminal with a peg provided on a surface of the structure forming a slot 420 provided by the top cover 405. Other embodiments may utilize other alignment features for positioning the spring mounted terminals 430.

Aligned in this manner, each spring mounted terminal 430 may be secured in place on one end by the peg, while the other end of the spring mounted terminal 430 is positioned on one of the contact pads 415 of the PCB. As described in additional detail with regard to FIG. 5A, a cap 435 may be fastened to the housing 405 using screws 440 such that the stacked components are fixed together, while still allowing rotation of the prongs 425 about the saddle 405a portion of top cover 405. Assembled in this manner, this portion of the AC plug 400 does not utilize any wires, thus simplifying the assembly process and improving reliability of the AC plug 400. By eliminating wires between prongs 425 and the power circuit, no wire harnesses or soldering is required to connect the prongs to the power circuit accessed via PCB 410. Instead, prongs 425 are connected to the contact pads 415 of PCB 410 through the fastening of cap 435. By eliminating wire harness connection from the prongs 425 to PCB 410, the cost of PCB 410 is reduced, in addition to maintaining the simplicity of the described assembly process of AC plug 400.

FIG. 5A is a cutaway diagram depicting certain components of an assembled AC plug, according to various embodiments, with foldable prongs that are in an extended position. As described, the components of an AC plug according to embodiments may be stacked and secured together by fastening a cap 530 to a top cover 520 of the AC plug. By fastening cap 530 in this manner, PCB 525 is also fastened to the top cover 520. FIG. 5B is cutaway diagram depicting a rotated perspective of the AC plug of FIG. 5A. As illustrated in FIG. 5B, with the assembly holes of the cap 530, PCB 525 and top cover 520 aligned, screws 550 may be used to fasten the cap 530 to the top cover 520 such that the spring mounted terminal is secured against the top cover 520 and the contact pad 560 of PCB 525, which is also secured to the top cover 520.

As described, during assembly, each spring mounted terminal 535 may be positioned on top cover 520 by aligning locating slots on one of the spring mounted terminal 535 with peg structures 555 located on a structure provided on the inner side of top cover 520, where each such structure includes a cavity that is a slot 515 in which a prong may be recessed. Positioned in this manner, the other end of the spring mounted terminal 535 is positioned on the contact pad 560 of PCB 525. By fastening cap 530, the spring mounted terminal 535 is secured in place above prong 550 with one end of the terminal secured to a contact pad 560.

In FIG. 5A, prong 505 is in an extended position and is thus ready for insertion into a receptacle of an AC outlet. In this position, a cam 540 protruding from prong 505 is in contact with the spring mounted terminal 535. Once the AC plug is plugged into an outlet, electricity flows to the power cord via the pathway established by the cam 540 of prong 505 in contact with the spring mounted terminal 535, which is secured against a contact pad 560 of PCB 525. As described, PCB 525 includes circuitry for routing power from the contact pads 560 to an AC cord connected to the top cover 520. Using this configuration, power may be provided to an IHS via an AC adapter.

As provided above, many IHSs are portable DC devices that rely on an AC adapter in order to provide power for charging the internal batteries of the portable devices. In many instances, a portable device is transported along with an AC adapter for use in occasional or regular recharging of the portable IHS batteries. Accordingly, an AC adapter utilized by a portable IHS is preferably also portable. Upon terminating a charging session, an AC plug is unplugged from an AC outlet. In the embodiments of FIGS. 5A and 5B, once unplugged, prong 505 may be rotated in direction 510 until the prong 505 is recessed within the slot 515 provided by top cover 520. As described, prong 505 may be connected to another prong of the AC plug via a connecting cylinder that can be rotated within a saddle structure of top cover 520, thus allowing the prongs 505 to be rotated in direction 510. In FIG. 5B, the inside cavity of slot 515 is exposed by the cutaway illustrations that removes a portion of the top cover 520 structure that forms the slot. This cutaway of FIG. 5B also removes certain portions of top cover 520 structures that secure the prong 505 within the top cover 520.

FIG. 5C is a cutaway diagram depicting an AC plug with foldable prongs in a folded position, according to various embodiments. With the prong 505 rotated to completion in direction 510, prong 505 now rests within slot 515 of the top cover 520, such that prong 505 is recessed within the slot 550. And this folded position, the cam 540 of prong 505 has been rotated away from spring mounted terminal 535. The rotation of prong 505 to a recessed position results in a flat portion 545 of prong 505 being positioned below the spring mounted terminal 535 such that the spring extends to an unloaded configuration. As illustrated, unlike cam 540, the flat portion 545 of prong 505 does not protrude towards the spring mounted terminal. Accordingly, the power circuit has been opened and power can no longer flow between prong 505 and the spring mounted terminal 535.

As described, prong 505 may be rotated to an extended position, such as in FIG. 5A, in which the prong 505 is connected to the power circuit via contact with the spring mounted terminal 535 by the cam 540 portion of the prong. In the extended position, cam 540 loads the spring mounted terminal 535 such that it exerts force against cam 540 and maintains the spring mounted terminal 535 securely in contact with cam 540. The force exerted by spring mounted terminal 535 also serves as a detent that prevents the prongs from rotating freely. From this loaded position, prong 505 may then be rotated to a retracted, unloaded position, such as in FIG. 5C, in which the prong 505 is no longer connected to the power circuit. Importantly, embodiments that support a foldable prong 505 in the described manner are connected to the power circuit without any wires connecting the prong 505 to the power circuit. In particular, no soldering or wire harnesses are required to connect the prong 505 to the power circuit provided by PCB 525. By eliminating the use of such wires, the simplicity and economy of the assembly process described in with regard to FIG. 4 is maintained. The components comprising the foldable prong of an AC plug may be stacked as described and fastened together using only the screws that secure the cap 530 to the top cover 520, while also securing the spring mounted terminal 535 and PCB 525 in place. Without wires connecting the prong 505 to the power circuit, the stacked assembly process of FIG. 4 may be completed without soldering, thus improving reliability in addition to simplifying the assembly of the AC plug.

This assembly process of FIG. 4 described with regard to a foldable prong AC plug 400 may also be utilized according to various embodiments to assemble a fixed prong AC plug, such as described with respect to FIG. 3B. FIG. 6 is a diagram illustrating the assembly, according to various embodiments, of an AC plug 600 with fixed prongs. The AC plug 600 with fixed prongs may be assembled through stacking and fastening of the depicted components in the illustrated sequence. As with the assembly of the foldable prong AC plug, the fixed prong AC plug 600 may be constructed by using the AC plug top cover 605 as a platform on which the remaining components of the plug are assembled. As illustrated, top cover 605 is the portion of the AC plug from which prongs 625 protrude.

During assembly of AC plug 600, the top cover 605 may be utilized as a base to which the described components are fastened. As illustrated, each of the prongs 625 may protrude to the inner side of the top cover 605 thus providing a connection surface on the inner side of the top cover 605. Various additional techniques may be utilized for providing connection surfaces to the plugs on the inner side of top cover 605. The assembly process may continue for fixed prong applications, with the positioning of spring mounted terminals 630 on the inner surface of top cover 605. As illustrated, one end of each spring mounted terminal 630 may be positioned such that a portion of each spring mounted terminal 630 rests on the connection surface of one of the prongs 625.

As described in additional detail with regard to FIG. 7, each spring mounted terminal 630 may include a locating hole that fits around a peg or other structure provided on the inner side of top cover 605. Once a spring mounted terminal 630 has been positioned using the peg, certain embodiments may utilize a bushing 645 that also fits on the portion of the peg that protrudes through the locating hole of the spring mounted terminal. Such bushings 645 may serve to secure the spring mounted terminal 630 in position and may also serve as buffer used to protect the PCB which will be next layer added to the assembly.

With the spring mounted terminals 630 in place, the assembly process may continue with the positioning of the PCB (printed circuit board) 610 on the top cover 605 of the AC plug such that assembly holes of the PCB 610 and top cover 605 are aligned. Additional features for positioning PCB 610 may be provided by the top cover 605. As illustrated in FIG. 7, in certain embodiments, PCB 610 may be positioned such that it is beneath one end of the spring mounted terminal 630, once the assembly has been completed. Accordingly, in some embodiments, the positioning of PCB 610 may include sliding the PCB 610 underneath the suspended ends of the spring mounted terminals 635. The positioning of the PCB 610 in this manner may also include positioning each suspended end of a spring mounted terminal 635 above a contact pad 615 provided on the PCB 610.

Once the PCB 610 has been positioned in this manner, as with the foldable prong AC plug, assembly of AC fixed prong AC plug 600 may be completed by fastening a cap 635 to the top cover 605 using screws 640 such that the stacked components are fixed together. In certain embodiments, the same cap 635 may be utilized in the assembly of both fixed prong and foldable prong embodiments. In fastening cap 635 to complete the assembly, the spring mounted terminals 630 are secured such that they are in contact with the contact pads 615 of PCB 610 on one end, while also securely in contact with a connection surface for one of the prongs 625.

Electricity drawn from prongs 625 may be transmitted to the contact pads 615 via the spring mounted terminals 630, in the same manner as the spring mounted terminal in the foldable prong plug of FIGS. 4 and 5A-C. As with the foldable prong plug, PCB 610 of fixed prong AC plug 600 may include circuitry that transmits electricity received at contact pads 615 to the wires of an AC cord connected to the AC plug 600, such as AC cord 310 of FIG. 3B. In certain embodiments, the same PCB 610 may be utilized for both fixed prong and foldable prong AC plugs according to embodiments.

FIG. 7 is a cutaway diagram depicting certain components of an AC plug 700 with fixed prongs, such as a portion of plug 600 assembled according to FIG. 6. As described with regard to the assembly, each spring mounted terminal 730 may be positioned during by aligning a hole on one end of the terminal with a peg 750 provided on the top cover 705. Other embodiments may utilize other alignment features for positioning the spring mounted terminals 630. Aligned in this manner, each spring mounted terminal 730 may be secured in place on one end by the peg 750, while the other end of the spring mounted terminal 730 is secured against one of the contact pads of the PCB 710.

In certain embodiments, spring mounted terminals 730 may be metal spring clips that are in an unloaded state prior to assembly. During assembly, spring mounted terminals 730 may be loaded such that they exert a moderate force against the connection surface of a prong 725 that protrudes through the top cover 705 and such that the spring mounted terminals 730 also exert enough force against top cover 635 to remain secured by the top cover 635 against a connection pad of the PCB 710. The top cover 605, 705 in the illustrative embodiment of FIGS. 6 and 7 is a Type G plug. Different regionalized top covers will present different configurations of prongs. Accordingly, different geometries of spring mounted terminals may be utilized in different embodiments in the same manner as the illustrative spring mounted terminals described herein.

As with the foldable prong plug of FIGS. 4 and 5A-C, the assembly of the fixed prong AC plug 600 and 700 in this manner, the fixed prongs of AC plug 700 are coupled to the power circuit without utilizing any wires in this coupling, and thus without requiring any soldering or wiring harnesses to connect the prongs to the PCB that provides connections to the power circuit. As described, eliminating such wiring reduces cost, improves manufacturing efficiency and improves reliability. The described assembly process also allows the use of several common components for both fixed prong and foldable prong, including the tub 305 and AC power cord 310 of FIGS. 3A and 3B, as well as a common PCB 410, 610, that connects the spring mounted terminals to the power circuit and a common cap 435, 635 that is used to fasten and secure the components of the AC plugs 400 and 600 in place.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An AC (Alternating Current) plug for providing power, the AC plug comprising:
   a cover comprising a plurality of prongs;
   a PCB comprising a plurality of contact pads;
   a plurality of spring mounted terminals; and
   a cap fastened to the cover, wherein the fastening of the cap secures a first end of each spring mounted terminal against a contact pad of the PCB, and wherein the fastening of the cap positions each spring mounted terminal for contact with a prong of the plurality of prongs.

2. The AC plug of claim 1, wherein the plurality of prongs are fixed to an outer side of the cover.

3. The AC plug of claim 1, wherein the spring mounted terminals are positioned based on an alignment of a second end of each of the spring mounted terminals with an alignment structure of the cover.

4. The AC plug of claim 1, wherein the fastening of the cap connects the prongs to a power circuit via the contact pads.

5. The AC plug of claim 4, wherein no wires are included in the connections between the plurality of prongs and the power circuit.

6. The AC plug of claim 1, wherein the cover comprises a plurality of slots, and wherein the each of the plurality of prongs are foldable prongs that may be rotated into a slot of the cover.

7. The AC plug of claim 6, wherein each of the plurality of prongs comprises a cam that contacts a spring mounted terminal when the foldable prongs are rotated to an extended position.

8. The AC plug of claim 7, wherein the cam of each of the plurality of prongs does not contact the respective spring mounted terminal when the foldable prongs are rotated to a folded position.

9. A method of assembling an AC (Alternating Current) plug for providing power, the method comprising:
   selecting a cover comprising a plurality of prongs;
   positioning a PCB on an inner side of the selected cover, wherein the PCB comprises a plurality of contact pads;
   positioning a plurality of spring mounted terminals, wherein a first end of each spring mounted terminal is positioned on a contact pad of the PCB; and
   fastening a cap to the cover, wherein the fastening secures the first end of each spring mounted terminal against a contact pad of the PCB, and wherein the fastening positions each spring mounted terminal for contact with a prong of the plurality of prongs.

10. The method of claim 9, wherein the cover comprises a plurality of slots, and wherein the each of the plurality of prongs are foldable prongs that may be rotated into a slot of the cover.

11. The method of claim 9, wherein the cover is selected from covers comprising prongs conforming to electrical outlets used in different geographic regions.

12. The method of claim 9, wherein the fastening connects each of the prongs to a power circuit of the PCB via contact with a spring mounted terminal that is fastened to a contact pad of the PCB.

13. The method of claim 12, wherein no wires are utilized to connect any of the plurality of prongs to the power circuit.

14. The method of claim 9, wherein the plurality of prongs are fixed to an outer side of the cover.

15. The method of claim 14, wherein each of the plurality of prongs comprises a cam that contacts a spring mounted terminal when the foldable prongs are rotated to an extended position.

16. The method of claim 15, wherein the cam of each of the plurality of prongs does not contact the respective spring mounted terminal when the foldable prongs are rotated to a folded position.

17. An AC (Alternating Current) adapter for providing power to an Information Handling System (IHS) via a power circuit, wherein the AC adapter comprises an AC plug comprising:
   a cover comprising a plurality of prongs;
   a PCB comprising a plurality of contact pads;
   a plurality of spring mounted terminals; and
   a cap fastened to the cover, wherein the fastening of the cap secures a first end of each spring mounted terminal against a contact pad of the PCB, and wherein the fastening of the cap positions each spring mounted terminal for contact with a prong of the plurality of prongs.

18. The AC adapter of claim 17, wherein the cover comprises a plurality of slots, and wherein the each of the plurality of prongs are foldable prongs that may be rotated into a slot of the cover.

19. The AC adapter of claim 17, wherein the fastening connects the prongs to a power circuit via the contact pads.

20. The AC adapter of claim 19, and wherein no wires are included in the connections between the plurality of prongs and the power circuit.

* * * * *